United States Patent
Hittel et al.

(10) Patent No.: US 10,243,280 B2
(45) Date of Patent: Mar. 26, 2019

(54) ELECTRICAL CONNECTOR FOR UNTERMINATED CABLES

(71) Applicant: Fluke Corporation, Everett, WA (US)

(72) Inventors: John Paul Hittel, Phoenix, AZ (US); Theodore J. Brillhart, Seattle, WA (US)

(73) Assignee: Fluke Corporation, Everett, WA (US)

( * ) Notice: Subject to any disclaimer, the term of this patent is extended or adjusted under 35 U.S.C. 154(b) by 209 days.

(21) Appl. No.: 15/286,393

(22) Filed: Oct. 5, 2016

(65) Prior Publication Data

US 2018/0097296 A1 Apr. 5, 2018

(51) Int. Cl.
| H01R 4/2404 | (2018.01) |
| H01R 13/02 | (2006.01) |
| H01R 24/28 | (2011.01) |
| G01R 31/02 | (2006.01) |
| H01R 11/20 | (2006.01) |
| H01R 103/00 | (2006.01) |
| H01R 4/50 | (2006.01) |

(52) U.S. Cl.
CPC ......... *H01R 4/2404* (2013.01); *G01R 31/021* (2013.01); *H01R 11/20* (2013.01); *H01R 13/025* (2013.01); *H01R 24/28* (2013.01); *H01R 4/5033* (2013.01); *H01R 2103/00* (2013.01); *H01R 2201/20* (2013.01)

(58) Field of Classification Search
CPC ..... G01R 27/2605; G01R 15/16; G06F 3/044; G06F 2203/04103; G06F 3/0416
USPC .................................. 324/679, 658, 686, 661
See application file for complete search history.

(56) References Cited

U.S. PATENT DOCUMENTS

| 3,858,159 | A * | 12/1974 | Worth .................. H01R 12/675 439/399 |
| RE36,700 | E | 5/2000 | McCarthy |
| 6,206,720 | B1 | 3/2001 | Larkin et al. |
| 6,392,317 | B1 * | 5/2002 | Hall ...................... E21B 17/003 174/47 |
| 9,991,716 | B2 * | 6/2018 | Cutright ............... G05B 19/048 |
| 9,992,855 | B2 * | 6/2018 | Larroux ................... H05G 1/58 |
| 2005/0218905 | A1 | 10/2005 | Prunk et al. |
| 2006/0172586 | A1 | 8/2006 | Rosenblatt |
| 2006/0178047 | A1 * | 8/2006 | Croan ................. H01R 13/6272 439/578 |

(Continued)

FOREIGN PATENT DOCUMENTS

| DE | 196 11 127 C1 | 9/1997 |
| FR | 2 835 105 A1 | 7/2003 |

(Continued)

OTHER PUBLICATIONS

International Search Report and Written Opinion dated Nov. 27, 2017 for PCT/US2017/055330, 15 pages.

*Primary Examiner* — Giovanni Astacio-Oquendo
(74) *Attorney, Agent, or Firm* — Seed IP Law Group LLP

(57) ABSTRACT

An electrical connector is provided. The electrical connector includes two or more electrically conductive prongs. Each electrically conductive prong may have a tapered distal end operable to axially contact a conductor of a cable when a force is applied to axially push the cable onto the two or more electrically conductive prongs. Each electrically conductive prong may have a proximal end operable to be electrically coupled to a respective connector conductor.

9 Claims, 4 Drawing Sheets

(56) References Cited

U.S. PATENT DOCUMENTS

2007/0117447 A1 5/2007 Hanks
2017/0319097 A1* 11/2017 Amthor .................. A61B 5/055

FOREIGN PATENT DOCUMENTS

GB  2477964 A   8/2011
WO  00/22698 A1  4/2000
WO  2011/058204 A1  5/2011

* cited by examiner

ELECTRICAL CONNECTOR FOR UNTERMINATED CABLES

BACKGROUND

Technical Field

This application is directed to an electrical connector and in particular an electrical connector having prongs that axially contact conductors of a cable.

Description of the Related Art

Certain testing devices, such as testing devices that measure a length of a cable, are connected to two conductors of a cable. Typically, personnel operating the testing devices terminate the cable and strip the insulators of the conductors to expose the conductors. The personnel then electrically couple the exposed conductors to the testing device. However, this approach is inefficient because it consumes the personnel's time and results in shortening the length of the cable. Further, it requires the personnel to have on hand the necessary tools for terminating and stripping the cable.

It is desirable to have a cable connector that can be expeditiously and efficiently coupled to conductors of a cable. Furthermore, it is desirable to have a cable connector that is configured to take advantage of the fact that the identity of the conductors with which the conductor is electrically coupled may be immaterial.

BRIEF SUMMARY

In an embodiment, an electrical connector includes an insulating base and two or more electrically conductive prongs mounted on the insulating base. Each electrically conductive prong may have a tapered distal end operable to axially contact a conductor of a cable when a force is applied to axially push the cable onto the two or more electrically conductive prongs. Each electrically conductive prong may have a proximal end operable to be electrically coupled to a respective connector conductor.

In an embodiment, the electrical connector includes a guiding and protective wall extending axially from the insulating base and forming a bore through which the two or more electrically conductive prongs axially extend. In an embodiment, the insulating base and the guiding and protective wall are one integrated piece.

In an embodiment, the guiding and protective wall is operable to guide the cable to the two or more electrically conductive prongs such that when the force is applied to axially push the cable, the two or more electrically conductive prongs axially contact at least two conductors of the cable. In an embodiment, the insulating base has two or more apertures, and the two or more electrically conductive prongs respectively extend at least partially through the two or more apertures. In an embodiment, the respective connector conductor of each conductive prong is coupled to a testing device.

In an embodiment, a testing device includes a connector including two or more connector conductors and two or more electrically conductive prongs. Each electrically conductive prong may have a tapered distal end operable to axially contact a conductor of a cable when a force is applied to axially push the cable onto the two or more electrically conductive prongs. Each electrically conductive prong may have a proximal end operable to be electrically coupled to a respective connector conductor of the two or more connector conductors. The testing device may include a processor electrically coupled to the two or more respective connector conductors of the two or more electrically conductive prongs, and configured to produce data representative of an electrical signal traversing at least one electrically conductive prong of the two or more electrically conductive prongs and test the cable based on the data.

In an embodiment, the tapered distal end is sharpened and operable to axially contact the conductor of the cable by piercing through an insulator of the cable or of the conductor, and by piercing the conductor. In an embodiment, testing the cable based on the data includes determining a length of the cable based on the data. In an embodiment, the connector includes an insulating base, and wherein the two or more electrically conductive prongs are mounted on the insulating base.

In an embodiment, the insulating base has two or more apertures, and the two or more electrically conductive prongs respectively extend at least partially through the two or more apertures. In an embodiment, the connector includes a guiding and protective wall extending axially from the insulating base and forming a bore through which the two or more electrically conductive prongs axially extend. In an embodiment, the insulating base and the guiding and protective wall are one integrated piece. In an embodiment, the guiding and protective wall is operable to guide the cable to the two or more electrically conductive prongs such that when the force is applied to axially push the cable, the two or more electrically conductive prongs axially contact at least two conductors of the cable. In an embodiment, the processor is electrically coupled the two or more electrically conductive prongs via portions of the prongs that respectively extend at least partially through the two or more apertures.

In an embodiment, an electrical connector includes two or more electrically conductive prongs. Each electrically conductive prong has a tapered distal end operable to axially contact a conductor of a cable when a force is applied to axially push the cable onto the two or more electrically conductive prongs. Each electrically conductive prong has a proximal end operable to be electrically coupled to a respective connector conductor.

In an embodiment, the electrical connector includes a guiding and protective wall forming a bore through which the two or more electrically conductive prongs axially extend. In an embodiment, the guiding and protective wall is operable to guide the cable to the two or more electrically conductive prongs such that when the force is applied to axially push the cable, the two or more electrically conductive prongs axially contact at least two conductors of the cable.

DETAILED DESCRIPTION

Figure 1:
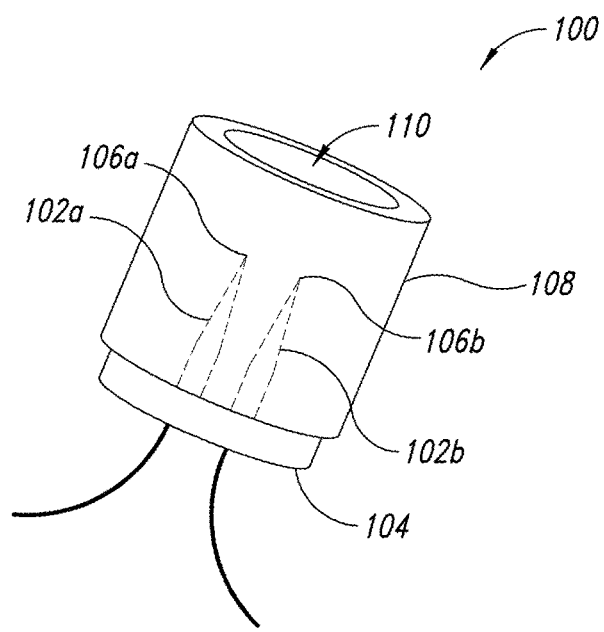
FIG. 1 shows a perspective view of an electrical connector.
Figure 2:
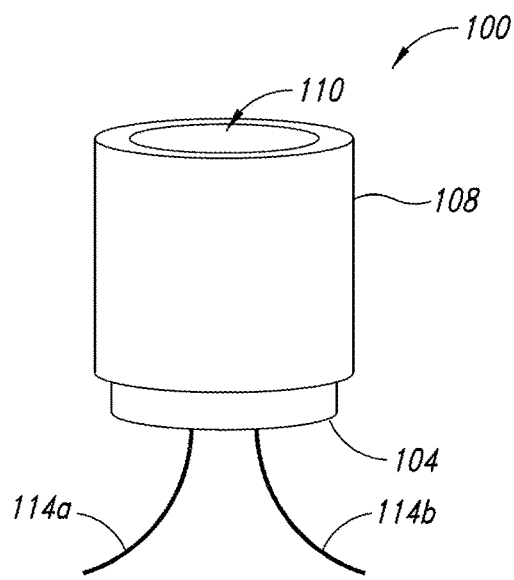
FIG. 2 shows another perspective view of the electrical connector.
Figure 3:
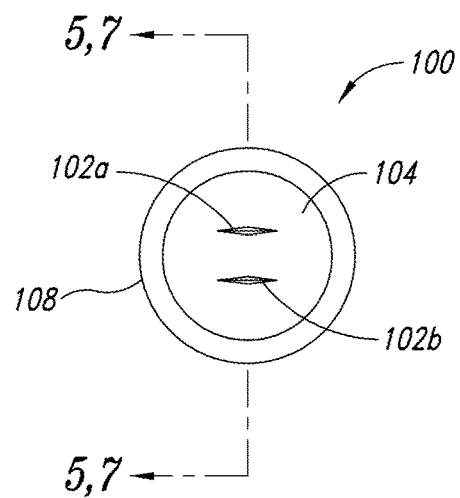
FIG. 3 shows a top plan view of the electrical connector.
Figure 4:
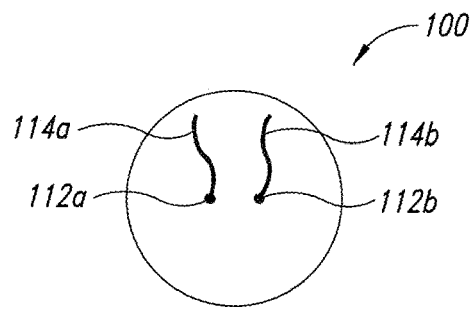
FIG. 4 shows a bottom plan view of the electrical connector.
Figure 5:
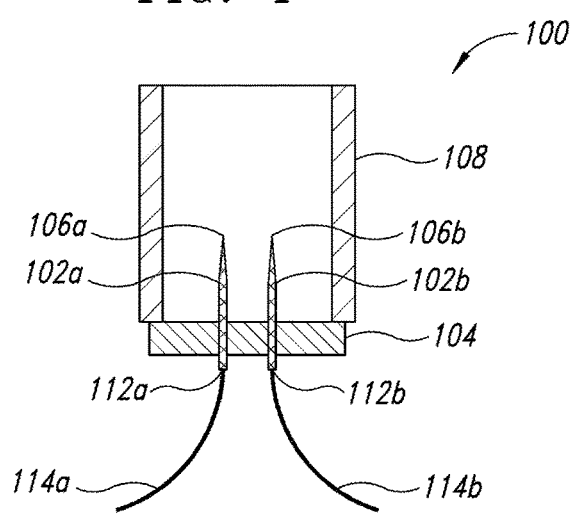
FIG. 5 shows a cross-sectional side view of the electrical connector taken at line—5,7 in FIG. 3.

FIGS. 1-5 show an electrical connector 100 for making an electrical connection with conductors of a cable. The electrical connector 100 includes two prongs 102a, 102b (collectively referred to herein by the numeral 102) and an insulating base 104. The prongs 102 are electrically conductive and may, for example, be made from a metal or any other conductive material. The prongs 102 are mounted on the insulating base 104 and axially extend from the insulating base 104. A distal end 106a, 106b of the respective prongs is tapered such that the prongs 102 may pierce through the cable and make electrical contact with conductors of the cable.

The electrical connector 100 includes a guiding and protective wall 108 extending axially from the insulating base 104. The guiding and protective wall 108 is generally cylindrical in shape and forms a bore 110 through which the cable may be pushed such that the conductors of the cable make contact with the prongs. The interior of the guiding and protective wall 108 is operative to guide the cable to the prongs. Also, the guiding and protective wall 108 prevents personnel using the electrical connector 100 from contacting the prongs 102 and reduces the possibility of injury, e.g., being potentially pierced or scratched by the prongs 102.

Distal ends 106a, 106b of the respective prongs 102a, 102b are tapered such that the prongs 102 may pierce through a cable and make electrical contact with conductors of the cable. Proximal ends 112a, 112b of the respective prongs 102a, 102b are electrically coupled to respective connector conductors 114a, 114b. The connector conductors 114a, 114b may be electrically coupled to a testing device as described herein for testing the cable.

In advanced testing techniques, such as time domain reflectometry (TDR) and far-end identity detection, a measurement device is connected to two or more conductors of a cable. The measurement device may test the cable using the two or more conductors. The electrical connector 100 may be used to connect the measurement device to the cable using the two or more prongs 102.

Figure 6:
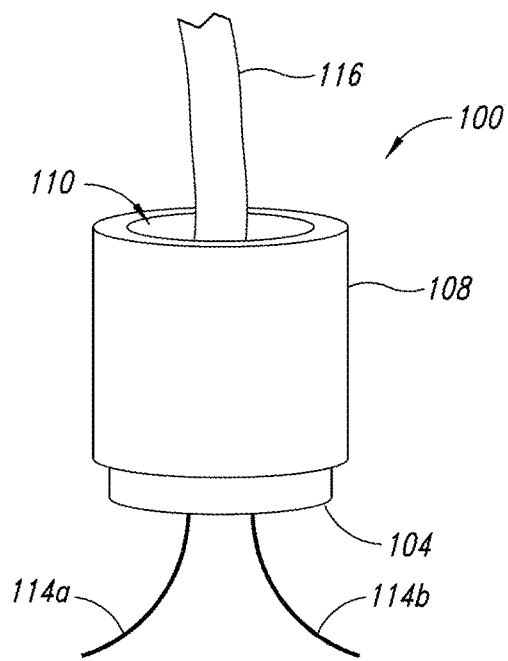
FIG. 6 shows a perspective view of the electrical connector receiving a cable.
Figure 7:
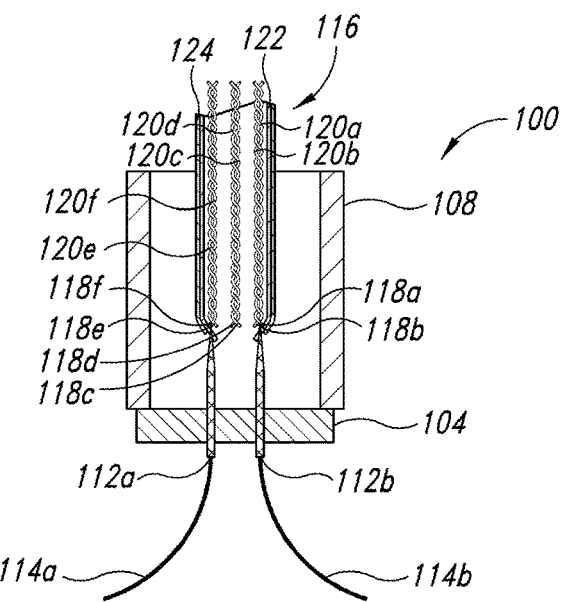
FIG. 7 shows a cross-sectional side view of the electrical connector taken at line—5,7 in FIG. 3 having received a cable.

FIGS. 6 and 7 respectively show a perspective view and a cross-sectional view of the electrical connector 100 receiving a cable 116. The cable 116 may be any type of cable that includes conductors. Examples of the cable 116 include a twisted pair cable, a co-axial cable or a non-metallic sheathed cable. The twisted pair cable may include three pairs of six conductors or four pairs of eight conductors, where each pair of conductors are twisted about one another within the cable.

The electrical connector 100 is operable to receive the cable 116 in the bore 110 formed by the guiding and protective wall 108 such that the prongs 102 of the electrical connector 100 make contact with one or more conductors of a plurality of conductors 118a-f of the cable 116. Although a twisted pair cable is shown in FIG. 7, it is noted that any other type of cable may alternatively be used.

In FIG. 7, the cable 116 is shown to include the plurality of conductors 118a-f. The plurality of conductors 118a-f are surrounded by a plurality of insulators 120a-f, respectively. The plurality of insulators 120a-f are surrounded by a conductive shield 122. The shield 122 is surrounded by an insulating jacket 124.

When the cable 116 is pushed against the prongs 102a,b of the electrical connector 100, the distal ends 106a,b of the prongs 102a,b touch and electrically contact one or more conductors of the plurality of conductors 118a-f. Tapering the prongs 102a,b permits piercing, puncturing or penetrating an insulator 120 to reach the conductor 118 it surrounds. Tapering the prongs 102a,b also permits piercing, puncturing or penetrating the insulating jacket 124 of the cable to reach the conductor 118 or the insulator 120 thereof.

The cable 116 may not be terminated and the plurality of insulators 120a-f may not be stripped to expose any one of the plurality of conductors 118a-f. This advantageously saves time of the personnel operating the connector 100 or a testing device with which it is coupled. Further, it alleviates the need for the personnel to have tools on hand for terminating or stripping the cable 116.

In various applications, it is desirable for a testing device to make contact with two or more conductors of a cable. The identity of the conductors may not be of import and the testing device may not be discerning as to the identity of the conductors of the cable with which contact is made. To perform a test on the cable, the testing device should be electrically coupled to two conductors of the cable. The particular identity of the conductor may not be of consequence, whereby the testing device may be coupled to any two conductors irrespective of their identity.

Examples of such testing devices include a cable length measurement device using time domain reflectometry (TDR) or a far-end identity detecting device. To perform a TDR cable length measurement, the cable length measurement device may be connected to any two conductors of the cable irrespective of their identity. The electrical connector 100 described herein may be used to electrically connect the cable length measurement device to the two conductors.

It may be desired that the electrical connector 100 not short (electrically couple) two or more conductors of the cable. The conductors of the cable may, for example, be shorted if the two or more conductors are connected to the same prong. In the event that the electrical connector 100 shorts two or more conductors of the cable, another attempt may be made at connecting the electrical connector 100 to the cable. For example, the cable may be retrieved or pulled from the electrical connector 100. The cable may then be rotated. Force may be applied to reconnect the cable with the electrical connector 100. Due to the rotation, the stationary prongs 102 will contact the cable at different positions than during the previous connection, thereby improving the likelihood that the two conductors or more conductors will be no longer shorted.

Figure 8:
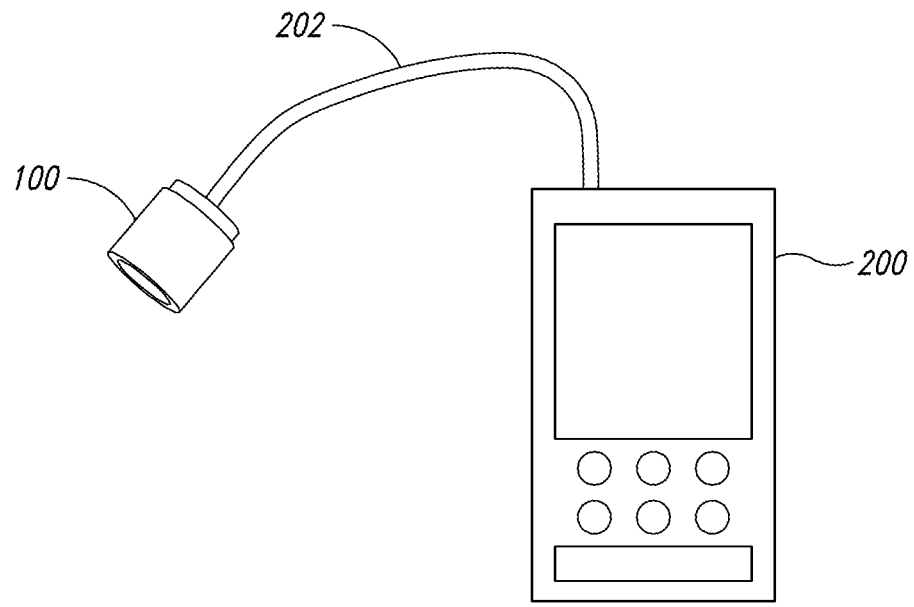
FIG. 8 shows the electrical connector coupled to a testing device.

FIG. 8 shows the electrical connector 100 coupled to a testing device 200. The electrical connector 100 is coupled to the testing device 200 using a testing device cable 202. The testing device 200 may be a cable length measurement device using TDR or a far-end identity detecting device, among others. The testing device cable 202 may include the connector conductors 114. The testing device cable 202 electrically connects the prongs 102 in the electrical connector 100 to the testing device 200.

The testing device 200 may include a processor that is electrically coupled to the connector conductors 114. The processor produces data representative of an electrical signal traversing at least one electrically conductive prong 104 and tests the cable 116 based on the data. The processor may determine the length of the cable 116 based on the data or an identity of a far end device connected to the cable. The testing device 200 may include a display that displays the measurement result.

Figure 9:
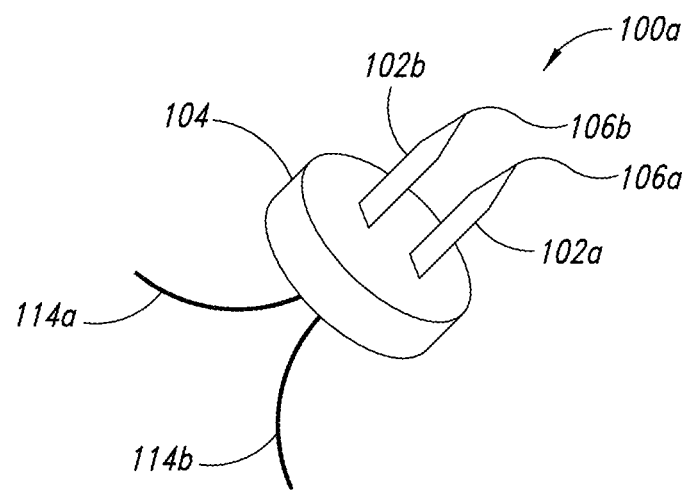
FIG. 9 shows the electrical connector in accordance with at least one embodiment.

FIG. 9 shows an electrical connector 100a in accordance with at least one embodiment. Similar elements of the electrical connector 100a to those of the electrical connector 100 have the same reference numerals. Compared to the electrical connector 100, the electrical connector 100a does not include the guiding and protective wall 108 and thus has a smaller profile. However, due to the absence of the guiding and protective wall 108, the prongs 102 of the electrical connector 100a are exposed. The electrical connector 100a may be mounted on a printed circuit board (not shown). The electrical connector 100a may be used for connecting a cable to the printed circuit board.

The various embodiments described above can be combined to provide further embodiments. Such changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing device, comprising:
   a connector including:
      two or more connector conductors; and
      two or more electrically conductive prongs, each electrically conductive prong having a tapered distal end operable to axially contact a conductor of a cable when a force is applied to axially push the cable onto the two or more electrically conductive prongs, and each electrically conductive prong having a proximal end operable to be electrically coupled to a respective connector conductor of the two or more connector conductors; and
   a processor electrically coupled to the two or more respective connector conductors of the two or more electrically conductive prongs, and configured to produce data representative of an electrical signal traversing at least one electrically conductive prong of the two or more electrically conductive prongs and test the cable based on the data.

2. The testing device of claim 1, wherein the tapered distal end is sharpened and operable to axially contact the conductor of the cable by piercing through an insulator of the cable or of the conductor, and by piercing the conductor.

3. The testing device of claim 1, wherein testing the cable based on the data includes determining a length of the cable based on the data.

4. The testing device of claim 1, wherein the connector includes an insulating base, and wherein the two or more electrically conductive prongs are mounted on the insulating base.

5. The testing device of claim 4, wherein the insulating base has two or more apertures, and the two or more electrically conductive prongs respectively extend at least partially through the two or more apertures.

6. The testing device of claim 4, wherein the connector includes:
   a guiding and protective wall extending axially from the insulating base and forming a bore through which the two or more electrically conductive prongs axially extend.

7. The testing device of claim 6, wherein the insulating base and the guiding and protective wall are one integrated piece.

8. The testing device of claim 6, wherein the guiding and protective wall is operable to guide the cable to the two or more electrically conductive prongs such that when the force is applied to axially push the cable, the two or more electrically conductive prongs axially contact at least two conductors of the cable.

9. The testing device of claim 1, wherein the processor is electrically coupled the two or more electrically conductive prongs via portions of the prongs that respectively extend at least partially through the two or more apertures.

* * * * *